(12) United States Patent
Lewis et al.

(10) Patent No.: US 7,491,642 B2
(45) Date of Patent: Feb. 17, 2009

(54) ELECTRICAL PASSIVATION OF SILICON-CONTAINING SURFACES USING ORGANIC LAYERS

(75) Inventors: Nathan S. Lewis, La Canada, CA (US); William Royea, Chicago, IL (US)

(73) Assignee: The California Institute of Technology, Pasadena, CA (US)

( * ) Notice: Subject to any disclaimer, the term of this patent is extended or adjusted under 35 U.S.C. 154(b) by 0 days.

(21) Appl. No.: 09/905,157

(22) Filed: Jul. 12, 2001

(65) Prior Publication Data

US 2002/0139975 A1 Oct. 3, 2002

Related U.S. Application Data

(60) Provisional application No. 60/217,749, filed on Jul. 12, 2000.

(51) Int. Cl.
*H01L 21/4763* (2006.01)
(52) U.S. Cl. .................... 438/642; 438/643
(58) Field of Classification Search .......... 247/642, 247/643; 438/780, 781, 642–643; 257/642, 257/643
See application file for complete search history.

(56) References Cited

U.S. PATENT DOCUMENTS

| | | | |
|---|---|---|---|
| 3,832,700 A | | 8/1974 | Wu et al. |
| 3,961,353 A | * | 6/1976 | Aboaf et al. ............. 257/565 |
| 4,106,951 A | | 8/1978 | Masi |
| 4,461,691 A | | 7/1984 | Frank |
| 4,608,097 A | | 8/1986 | Weinberger et al. |
| 4,960,722 A | * | 10/1990 | Ogawa ........................ 438/1 |
| 5,304,583 A | * | 4/1994 | Ogawa ..................... 522/148 |
| 5,360,759 A | * | 11/1994 | Stengl et al. ............. 438/510 |
| 5,429,708 A | * | 7/1995 | Linford et al. ............. 216/66 |
| 5,599,742 A | | 2/1997 | Kadomura |
| 5,972,724 A | | 10/1999 | Arndt et al. |
| 6,147,405 A | | 11/2000 | Hu |
| 6,197,668 B1 | | 3/2001 | Gardner et al. |

(Continued)

FOREIGN PATENT DOCUMENTS

DE 42 29 031 A1 3/1994

(Continued)

OTHER PUBLICATIONS

Translation of JP 6-84852 A.*

(Continued)

*Primary Examiner*—Carl Whitehead, Jr.
*Assistant Examiner*—Colleen E Rodgers
(74) *Attorney, Agent, or Firm*—Joseph R. Baker, Jr.; Gavrilovich Dodd & Lindsey LLP

(57) ABSTRACT

Electrical structures and devices may be formed and include an organic passivating layer that is chemically bonded to a silicon-containing semiconductor material to improve the electrical properties of electrical devices. In different embodiments, the organic passivating layer may remain within finished devices to reduce dangling bonds, improve carrier lifetimes, decrease surface recombination velocities, increase electronic efficiencies, or the like. In other embodiments, the organic passivating layer may be used as a protective sacrificial layer and reduce contact resistance or reduce resistance of doped regions. The organic passivation layer may be formed without the need for high-temperature processing.

15 Claims, 9 Drawing Sheets

U.S. PATENT DOCUMENTS 6,312,581 B1 * 11/2001 Bruce et al. ................. 205/124

FOREIGN PATENT DOCUMENTS

| JP | 54-76629 | | 6/1979 |
|---|---|---|---|
| JP | 63-161672 | | 7/1988 |
| JP | 6-84852 | | 3/1994 |
| JP | 06084852 A | * | 3/1994 |

OTHER PUBLICATIONS

Wolf, et al. Silicon Processing for the VLSI Era, vol. 1-Process Technology, Lattice Press: Sunset Beach CA, 1986, p. 5.*

Bansal et al. "Alkylation of Si surfaces using a two-step halogenation/Grignard route" Journal of the American Chemical Society, vol. 118, 1996, pp. 7225-7226.*

Ikawa et al., "A New Surface Protecting Layer for Si Substrate Preventing Surface Oxidation," J. Electrochem. Soc., vol. 138, No. 8 pp. 2382-2386, Aug. 1991.

Wolf, Stanley and Tauber, Richard N., "Silicon Processing for the VLSI Era: Process Technology," Lattice Press: Sunset Beach, CA. pp. 264-267 (1986).

* cited by examiner

ELECTRICAL PASSIVATION OF SILICON-CONTAINING SURFACES USING ORGANIC LAYERS

RELATED APPLICATIONS

This application claims priority under 35 U.S.C. § 119(e) to U.S. patent application Ser. No. 60/217,749 entitled "Electrical Passivation of Silicon-containing surfaces Using Organic Layers" by Lewis et al. filed Jul. 12, 2000. This application is also related to U.S. patent application Ser. No. 09/305,125 entitled "Stabilization of Si Photoanodes in Aqueous Electrolytes Through Surface Alkylation" by Lewis at al. filed May 4, 1999. Both applications are assigned to the current assignee hereof and incorporated herein by reference.

STATEMENT AS TO FEDERALLY SPONSORED RESEARCH AND DEVELOPMENT

The U.S. Government has certain rights in this invention pursuant to Grant No. CHE-9974562 awarded by the National Science Foundation.

FIELD OF THE INVENTION

This invention relates in general to electrical structures and processes for forming electrical devices, and more particularly, to electrical structures and processes for forming electrical devices having organic layers chemically bonded to a silicon-containing surface.

DESCRIPTION OF THE RELATED ART

Obtaining acceptable electrical properties of semiconductor surfaces is critical to the performance of many semiconductor-based electrical devices. Surface electrical properties become especially important as devices shrink in size, because the surface-to-volume ratio of the device components becomes higher and surfaces play a more important role in the overall device properties. In general, surfaces of crystalline solids are sites of electrical defects because the atoms at the surface do not experience the same bonding as atoms in the bulk of the crystalline material. Structurally or electrically defective surface sites are generally denoted as surface states or dangling bonds. Reduction of surface states is an important feature in improving the performance of electrical devices because such reduction lowers the level of electrical defects and provides improved electrical device properties of the resulting device structures.

Surface states that form electrical defects are a particularly important issue for silicon-based electrical devices. When silicon is exposed to air, a native oxide forms on the surface of the silicon. This native oxide contains a significant density of surface states at the interface between the crystalline silicon and the native oxide. These surface states allow electrons and holes to combine thereby reducing the current flow through the electrical device. The poor electrical properties of such surfaces are manifested in many physical properties of electronic devices formed form such materials. Some of these electrical properties include the surface recombination velocity, which represents the rate at which electrons and holes recombine at the surface of the device, the lifetime of charge carriers in the device, the excess interface capacitance due to charge carriers residing in residual dangling bonds at the device surfaces, the open circuit voltage of photovoltaic devices, the rectification ratio and leakage current of semiconductor/metal Schottky diodes, the voltage-versus current gain properties of metal-oxide-semiconductor field effect transistors, and a variety of other electrical properties of such electronic devices.

Some methods to passivate the surface of crystalline silicon to reduce the number of dangling bonds and to reduce the surface state density, thereby obtaining improved electrical devices through improvements in the properties of the surface of the silicon, have been explored in the past. A H-terminated silicon substrate can be formed upon exposure of the crystalline silicon to hydrogen gas, to a hydride-containing reducing agent, or to aqueous acids. However, the H-terminated silicon-containing surface is not stable in the presence of air. Similarly, halogens have been used to form halogen-covered silicon-containing surfaces, but such surfaces likewise suffer from a similar instability in air. In addition, such surfaces have poor surface recombination velocities in contact with air, allowing electrons which should be flowing as electrical current to recombine with holes thereby providing inferior electrical properties of the resulting devices and device structures.

Silicon can be covered with a thermally grown oxide formed under controlled conditions such that there is a low interface state density at the resulting silicon/silicon dioxide interface. However, silicon dioxide is an electrical insulator and often the thickness of this insulator is too great for formation of certain electrical device structures, in which little or no silicon oxide is desired on the silicon-containing surface.

Formation of silicon oxides requires high temperatures, and often these high temperatures interfere with previous device processing acts which cannot tolerate high processing temperatures. The exposure to high temperature required for form the silicon dioxide, therefore, produces degraded performance from the resulting electrical device or requires an alteration in the flow of process acts to form the final desired device structure. In addition, silicon dioxide has too low of a dielectric constant for use in certain device structures in which a layer having a high dielectric constant but a low surface state density at the interface with the silicon is desired for good electrical device performance.

Also, during formation of electrical devices, formation of too much silicon oxide or exposure of the surface to undesired contaminants may adversely affect device performance. If too much native silicon oxide is formed, a subsequent contact metalization may make poor electrical contact, if any, to the substrate. Likewise, too much silicon oxide may prevent diffusion of dopant from an overlying layer into the substrate. To reduce these effects, many manufacturing sites have queue times between acts. Unfortunately, queue times are difficult to implement in manufacturing. A backlog of work at a piece of equipment or equipment downtime may make queue time compliance very difficult to administer. Reliability, reproducibility, and other concerns typically follow from the use of queue times.

Organic layers have been formed that are bonded to porous silicon. Crystalline silicon does not emit visible light. Unlike crystalline silicon, porous silicon emits visible light and chemically modified porous silicon structures can have acceptable photoluminescence properties. Chemical modification of oxide-coated crystalline silicon surfaces has been used to form electrochemical devices and sensors.

Although the existing methods of forming silicon-containing surfaces have some usefulness, there still remains a need in the art for silicon-containing surfaces that have good electrical properties and/or are chemically passivated.

SUMMARY OF THE INVENTION

An organic passivating layer that is chemically bonded to a silicon-containing surface may be used to improve the electrical properties of silicon-based electronic materials and to improve the properties of electrical devices resulting from the use of such materials. In different embodiments, the organic passivating layer may remain within finished devices to reduce dangling bonds, improve carrier lifetimes, decrease surface recombination velocities, allow controlled spacing on the molecular scale between various other layers in the device, or to increase the electronic efficiencies of the surfaces and devices. In other embodiments, the organic passivating layer may be used as a protective sacrificial layer which ultimately reduces contact resistance or which ultimately reduces the resistance of doped regions in the device.

In one set of embodiments, an electrical structure comprises a crystalline material comprising silicon, wherein the crystalline material has a surface, and an organic layer is chemically bonded to the surface of the crystalline material. An electrical property of the electrical structure may be significantly different compared to the same structure without the organic layer. In another set of embodiments, a process can be used to form an electrical device that includes the electrical structure.

In another set of embodiments, the organic layer can be used as a reactive layer to form another organic or inorganic layer having desired properties, in which the second layer is physically and chemically separated from the underlying silicon substrate by the organic layer.

In still another set of embodiments, a process for forming an electrical device may comprise forming a patterned insulating layer over at least a portion of the electrical device. The patterned insulating layer can define an opening. A silicon-containing region may have an exposed portion at the opening. The silicon-containing region may be at least part of an electrical component within the electrical device. The process can also comprise forming an organic layer chemically bonded to the surface of the silicon-containing region. The process can further comprise removing the organic layer and forming a metal-containing layer after removing the organic layer. At least a portion of the metal-containing layer may contact the exposed portion of the silicon-containing region, and the metal-containing layer may be part of an electrical connection to the silicon-containing region.

In still another set of embodiments, a process for forming an electrical device can comprise forming a patterned insulating layer over at least of the electrical device. The patterned insulating layer may define an opening. A silicon-containing region may be an exposed portion at the opening, and the silicon-containing region may be at least part of an electrical component within the electrical device. The process can also comprise forming an organic layer chemically bonded to the surface of the crystalline material. The process can further comprise removing the organic layer and forming a dopant-source layer that may contact the exposed portion of the silicon-containing region.

The foregoing general description and the following detailed description are exemplary and explanatory only and are not restrictive of the invention, as claimed.

BRIEF DESCRIPTION OF THE DRAWINGS

The present invention is illustrated by way of example and not limitation in the accompanying figures.

Figure 1:
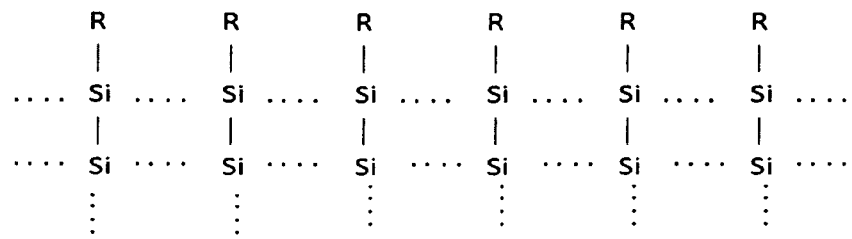
FIG. 1 includes an illustration showing an organic layer chemically bonded to a silicon containing substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Reference is now made in detail to the exemplary embodiments of the invention, examples of which are illustrated in the accompanying drawings. Wherever possible, the same reference numbers will be used throughout the drawings to refer to the same or like parts (elements).

Electrical structures and devices may be formed and include an organic passivating layer that is chemically bonded to silicon to improve the electrical properties of electrical devices. In different embodiments, the organic passivating layer may remain within finished devices to reduce dangling bonds, improve carrier lifetimes, decrease surface recombination velocities, increase capacitance, or provide improvements in other electronic properties, such as voltage. In other embodiments, the organic passivating layer may be used as a protective sacrificial layer and reduce the contact resistance or reduce the resistance of doped regions.

Attention is now directed to specific embodiments. The semiconductor substrate includes silicon atoms but may also include other Group IVA atoms, such as germanium, carbon, or the like. The semiconductor substrate may be substantially monocrystalline and have its primary surface along the (100), (111), or other crystal plane. The substrate may be formed using a Czochralski-grown or float-zone process. The semiconductor substrate may also include an epitaxial layer overlying a semiconductor bulk material, semiconductor-on-insulator, polycrystalline semiconductor material, amorphous semiconductor material, or the like. Each of these materials typically includes silicon atoms. In many embodiments, the silicon-containing substrates, materials, or layers are silicon substrates, silicon materials, or silicon layers.

Crystalline silicon can be transformed through etching or physical processing to produce a layer of material having at least 30% porosity and a collection of nanometer-sized physical protrusions, with such material having distinct physical and optical properties and commonly denoted as porous silicon. Crystalline silicon does not emit visible light and is useful in many electrical devices. Unlike crystalline silicon, porous silicon emits visible light and chemically modified porous silicon structures can have acceptable photoluminescence properties. Chemical modification of oxide-coated crystalline silicon surfaces has been used to form electrochemical devices and sensors. A portion of the silicon-containing material in electrical devices immediately adjacent to the organic layer may have a porosity less than approximately 30 percent. In another embodiment, the porosity may be no greater than approximately 10 percent.

The organic layer can contain a variety of functional groups in broad ranges of chemical classes that are considered members of organic molecules, such as alkanes, alkenes, alkynes, dienes, alicyclic hydrocarbons, arenes, alcohols, ethers, ketones, aldehydes, carbonyls, carbanions, polynuclear aromatics and derivatives of such organics (e.g., halide derivatives, etc.), biomolecules, such as sugars, isoprenes and isoprenoids, fatty acids and derivatives, etc. Other functional groups and examples of members of organic layers are listed below in Table 1. The groups previously described and those in Table 1 are merely to illustrate and not limit the present invention.

TABLE 1

Examples of Functional Groups

Acyl Derivatives
Alcohols, Thiols and Ethers
Aldehydes and Ketones
Aldols
Alkyl Halides
Alkynes & Alkenes
Alkynes, Reactions
Amines, aliphatic or aromatic
Arenes
Aromatics
Aryl Amines and Phenols
Aryl Side-Chains
Arylamines & Diazonium Salts
Carboranes
Carbocations
Carbonyls
Carboxylic Acids and Derivatives
Chirality & Stereogenic Centers
Conjugated Dienes
Cycloalkanes, such as cyclohexane
Diazonium Salts
Diels-Alder Reaction products
Dienes
Ethers and Alcohols
Isomers
Ketones and Aldehydes
Organometallics
Polyenes
Phosphines
Phosphates
Thioethers
Thioesters
Thionyls
Thiols
Ylides FIG. 1 includes an illustration of an organic layer formed over silicon atoms within a semiconductor substrate. To form the chemically bonded organic passivation layer, the silicon-containing surface is chemically reacted with a reagent or with a series of reagents to produce an organic layer that is chemically bonded to the silicon-containing surface. The reactions may occur in the gas phase, liquid phase, or solid phase to produce layers in which there is a chemical bond between the silicon-containing surface and the resulting organic layer. The chemical bonding between the silicon and the organic layer is typically covalent bonding but may be ionic or electrostatic in character as well.

The organic layer is illustrated by the letter "R." The organic layer may include carbon, hydrogen, oxygen, nitrogen, sulfur, phosphorus, or other similar elements. Most (over half) of the atoms within the organic layer are typically carbon and hydrogen.

R may be selected from a group called alkyl, allyl, polymer, or other organic materials. The linkage to the silicon can be formed by a bond from silicon to oxygen bonded to carbon, as in an alkoxide, from a bond from silicon to phosphorus, nitrogen, sulphur, or other species that also are linked to organic groups. For an alkoxide, the Si—R bonds would be replaced by Si—O—R bonds.

The organic layer over the semiconductor substrate may include a monolayer of a hydrocarbon group (alkyl, allyl, alkoxide, etc.) or may include a significantly thicker polymer layer. The organic layer may have functional groups as described in Table 1 structurally within the layer or at the terminus of the layer. Therefore, the thickness of the organic layer may vary from approximately 0.3 nm to over one micron. For embodiments where a monolayer is to be formed, the thickness generally will not exceed approximately 9 nm.

In one embodiment of the invention, the silicon-containing surface is first chemically etched to produce a H-terminated silicon-containing surface. The etching can occur in the liquid or gaseous phases and can be performed with a variety of reagents. For example, the silicon-containing surface may be etched in approximately 40 percent ammonium fluoride ($NH_4F$) aqueous solution to yield a hydrogen-terminated ("H-terminated") surface along the primary surface of the semiconductor substrate.

In another embodiment, the silicon-containing surface is cleaned in vacuum and consequently "activated" or made reactive chemically towards further reagents. Alternatively, the surface can be heated, bombarded with ions or electrons or otherwise cleaned to expose a reactive silicon-containing surface.

The reactive silicon-containing surface is then reacted with a reagent, or with a series of reagents, to produce an organic layer that is chemically bonded to the silicon-containing surface. The organic reagent can be reacted directly with an activated, reactive silicon-containing surface, or the organic reagent can be reacted with a silicon-containing surface prepared in an intermediate state that is reactive towards the organic reagent used to form organic layer that is chemically bonded to the silicon-containing surface. The reactions can be performed in the gas phase, liquid phase, or in the solid state.

In one embodiment, an organic reagent, such as an olefin, can be reacted with the cleaned reactive silicon-containing surface to form a silicon-carbon bonded species. Similarly, molecules with two double bonds can be used in a Diels-Alder reaction to form chemical bonds with the silicon-containing surface. Other methods of forming silicon-carbon bonds from reactive silicon-containing surfaces in vacuum are also useful and will be known to those skilled in the art. Similarly, the silicon-containing surface can be reacted with sulfur or oxygen-containing organic reagents having functional groups that will react with the silicon-containing surface to form a chemically-bonded organic layer on the resulting silicon-containing surface. Such functionality can include alcohols, which can form silicon oxygen bonds that tether the organic group to the silicon-containing surface, thiols, amines, and other reactive organic reagents.

In another embodiment, organic reagents can be exposed to etched H-terminated silicon substrates. Such reagents can include double bonds in conjunction with ultraviolet light, radical initiators, or heat, which form silicon carbon bonds to the silicon-containing surface. For example, the semiconductor substrate may be exposed to an organometallic compound having a general composition that includes bonding of the type R-M-X, where R is an organic group, M is a metal atom, and X is a halogen atom. The hydrocarbon group R may be an alkyl group having one to twenty carbon atoms, although more carbon atoms on the alkyl group may be used. M may include magnesium, copper, thallium, aluminum, zinc, or the like. X may include chlorine, bromine, iodine, or the like. A specific embodiment can utilize Grignard reagents, where M is magnesium and X is chlorine, bromine, or iodine. The organometallic reagent can react with the silicon-containing surface to form an organic layer that is chemically bonded to the silicon-containing surface. Alternatively, an alkyl-lithium reagent (or other reagents of the formula R-M) may be used in place of the Grignard reagent.

In still another embodiment, the alkyl group may be formed by terminal olefin reduction with the H-terminated silicon-containing surface. For example, after forming a H-terminated surface of the semiconductor substrate, the substrate may be immersed in approximately equal volumes of $CH_2=C_nH_{2n}$ (n=5, 7, 9, etc.) and approximately 1.0 M ethyl aluminum chloride ($EtAlCl_2$) in a hexane solution at approximately room temperature (17-25° C.) for a time period in a range of approximately 10-14 hours.

In still another set of embodiments, an alkoxide group may be formed instead of an alkyl group. The alkoxide group may include —OCH3, —OC2H5, or the like. For example, a H-terminated semiconductor substrate may be exposed to an alcoholic halogen or alcoholic ferrocenium solution to form the alkoxide group. Alternatively, an anodic electrical current can be used to accomplish the reaction of the silicon-containing surface to form the chemically bonded silicon alkoxide species. In another embodiment, a metal alkoxide (M-O—R) may be used. The metal may include lithium, potassium, or the like. R may be an alkyl group (e.g., methyl, ethyl, propyl, or the like) or an allyl group and may contain other functionality including fluorine, chlorine, or other organic functional groups such as those listed in Table 1.

In another embodiment, the hydrogen-terminated silicon-containing surface can be transformed into an intermediate surface that is then reactive with an organic reagent to form the desired chemically-bonded organic layer on the silicon-containing surface. An embodiment of such an intermediate surface is obtained by using a halogen source to convert the reactive silicon-containing surface or the H-terminated silicon-containing surface into a halogen-terminated silicon-containing surface. Chlorination may be performed using phosphorus pentachloride (PCl5) or chlorine (Cl2) gas. Alternatively, other halogens or halogen sources including bromine (e.g., Br2, HBr, etc.), iodine (I2, CHI3, etc.), fluorine, or other reagents that produce reactive intermediate surfaces may also be used.

The reactive intermediate surface can then be exposed to the organic reagent to produce the desired chemical bonding between the silicon and the organic species. Organometallic materials may be used and include methyl magnesium chloride (CH3MgCl), methyl magnesium bromide (CH3MgBr), n-octyl magnesium bromide (C8H17MgBr), or the like. In this reaction, the halogen atoms are replaced by the hydrocarbon group from the organometallic compound to form an organic layer that is chemically bonded to the surface of the semiconductor substrate. In general, removal of the halogen-containing intermediate layer to form a covalently bonded organic layer can be done using a variety of methods, including organometallic reagents, such as Grignards and organolithium compounds, organocopper compounds, and the like.

In another embodiment, the halogen-terminated silicon-containing surface can be exposed to alkoxides or to other reagents that will produce chemical bonds between the silicon and the organic group.

In another embodiment, a halogen-terminated semiconductor substrate may be exposed to an allyl-M-X compound to form an allyl-terminated semiconductor substrate surface. Other organic functionality can also be introduced into the organic layer using similar methods.

In another embodiment, the chemically bonded organic group can be transformed by subsequent chemical reaction into another chemically bonded organic species. For example, an allyl group may be formed from an alkyl group. The alkyl-terminated semiconductor substrate surface may be formed using any of the processes previously described. The alkyl-terminated semiconductor substrate may be exposed to a halide including chlorine, bromine, or the like and ultraviolet light to form a halogenated alkyl group. The semiconductor substrate with the halogenated alkyl group may be exposed to a base in the presence of alcohol. The base may include potassium hydroxide (KOH), ammonium hydroxide (NH4OH), or the like. The reaction can form an allyl-terminated semiconductor substrate surface, a halide salt (KX, NH4X, or the like), and water. In one specific embodiment, the allyl group typically has three to nine carbon atoms. In still other embodiments, more than nine carbon atoms may be used.

In another example, the chemically bonded organic group can be used as the initiation site of formation of another, second layer, which can be either physically attached or chemically bonded onto the chemically bonded organic layer. The second layer can be a metal, semiconductor, or insulator that is physically sputtered, electrodeposited, evaporated, spin-coated, sprayed, or otherwise physically deposited onto the organic layer. Alternatively, the second layer can be chemically reacted to become attached by formation of chemical bonds to the organic layer that is chemically bonded to the silicon substrate.

In one embodiment, the second layer is an organic polymer that is chemically bonded to the organic layer that is chemically bonded to the silicon. For example, the allyl group may be used to form a polymeric layer that is chemically bonded to the semiconductor substrate through the first said organic layer acting as a linker. The thickness of the polymer film can be at least approximately one nm and can exceed 100 nm or even one μm.

Insulating organic materials that can be used for such purposes can include, for example: main-chain carbon polymers, such as poly(dienes), poly(alkenes), poly(acrylics), poly (methacrylics), poly(vinyl ethers), poly(vinyl thioethers), poly(vinyl alcohols), poly(vinyl ketones), poly(vinyl halides), poly(vinyl nitrites), poly(vinyl esters), poly(styrenes), poly(aryines), and the like; main-chain acyclic heteroatom polymers, such as poly(oxides), poly(caronates), poly(esters), poly(anhydrides), poly(urethanes), poly(sulfonate), poly(siloxanes), poly(sulfides), poly(thioesters), poly(sulfones), poly(sulfonamindes), poly(amides), poly (ureas), poly(phosphazens), poly(silanes), poly(silazanes), and the like; and main-chain heterocyclic polymers, such as poly(furantetracarboxylic acid diimides), poly(benzoxazoles), poly(oxadiazoles), poly(benzothiazinophenothiazines), poly(benzothiazoles), poly(pyrazinoquinoxalines), poly(pyromenitimides), poly(quinoxalines), poly(benzimidazoles), poly(oxidoles), poly(oxoisinodolines), poly(diaxoisoindoines), poly(triazines), poly(pyridzaines), poly(pioeraziness), poly(pyridines), poly(pioeridiens), poly(triazoles), poly(pyrazoles), poly(pyrrolidines), poly(carboranes), poly(oxabicyclononanes), poly(diabenzofurans), poly(phthalides), poly(acetals), poly(anhydrides), carbohydrates, and the like.

TABLE 2

Major Classes and Examples of Polymers

| Major Class | Examples |
| --- | --- |
| Main-chain carbon polymers | poly(dienes), poly(alkenes), poly(acrylics), poly(methacrylics), poly(vinyl ethers), poly(vinyl thioethers), poly(vinyl alcohols), poly(vinyl ketones), poly(vinyl halides), poly(vinyl nitriles), poly(vinyl esters), poly(styrenes), poly(arylenes), etc. |
| Main-chain acyclic heteroatomic polymers | poly(oxides), poly(carbonates), poly(esters), poly(anhydrides), poly(urethanes), poly(sulfonates), poly(siloxanes), poly(sulfides), poly(thioesters), poly(sulfones), poly(sulfonamides), poly(amides), poly(ureas), poly(phosphazenes), poly(silanes), poly(silazanes), etc. |
| Main-chain heterocyclic polymers | poly(furan tetracarboxylic acid diimides), poly(benzoxazoles), poly(oxadiazoles), poly(benzothiazinophenothiazines), poly(benzothiazoles), poly(pyrazinoquinoxalines), poly(pyromellitimides), poly(quinoxalines), poly(benzimidazoles), poly(oxindoles), poly(oxoisoindolines), poly(dioxoisoindolines), poly(triazines), poly(pyridazines), poly(piperazines), poly(pyridines), poly(piperidines), poly(triazoles), poly(pyrazoles), poly(pyrrolidines), poly(carboranes), poly(oxabicyclononanes), poly(dibenzofurans), poly(phthalides), poly(acetals), poly(anhydrides), carbohydrates, etc. |

Other methods for modifying a silicon-containing surface to produce chemically bonded organic layers may include alkylation using addition of olefins to the H-terminated surface induced by UV irradiation, free-radical initiation, thermal activation, or hydrosilylation, direct reaction of the H-terminated surface with bromine-containing Grignard reagents, and activation using anodic or cathodic electrochemical processes.

In other embodiments, the silicon-containing surface can be activated through formation of Si—N, Si—S, or Si—O bonds through reaction of a X-terminated silicon-containing surface with amines, thiols, or alcohols, respectively. Additionally, reaction of H-terminated, single-crystal Si to form Si—O bonds that provide the linkages to organic groups bonded to the silicon-containing surface can be achieved by photoelectrochemical reaction with carboxylic acids, photochemical reaction with aldehydes, thermal reaction with aldehydes, and thermal reactions with alcohols with or without dissolved oxidants. Reactions of an olefin with a surface-propagated radical chain reaction on the H-terminated surface can also be used. In still other embodiments, ion bombardment (e.g., ion implantation using $Si^+$, $Ar^+$, or the like) can be used.

The electrical properties of the silicon-containing surface that has been modified with the chemically bonded organic layer can be monitored through a variety of electrical measurements on the silicon-containing surface or through measurements on electronic devices resulting from the use of the modified surface in the formation of electronic devices. A method that provides information on the electrical properties of the modified silicon-containing surface itself is to measure the surface recombination velocity using a contactless measurement technique. This method also is generally indicative of performance of other electrical device properties involving semiconductor surfaces or the properties of structures that are comprised at least in part from such surfaces.

Figure 2:
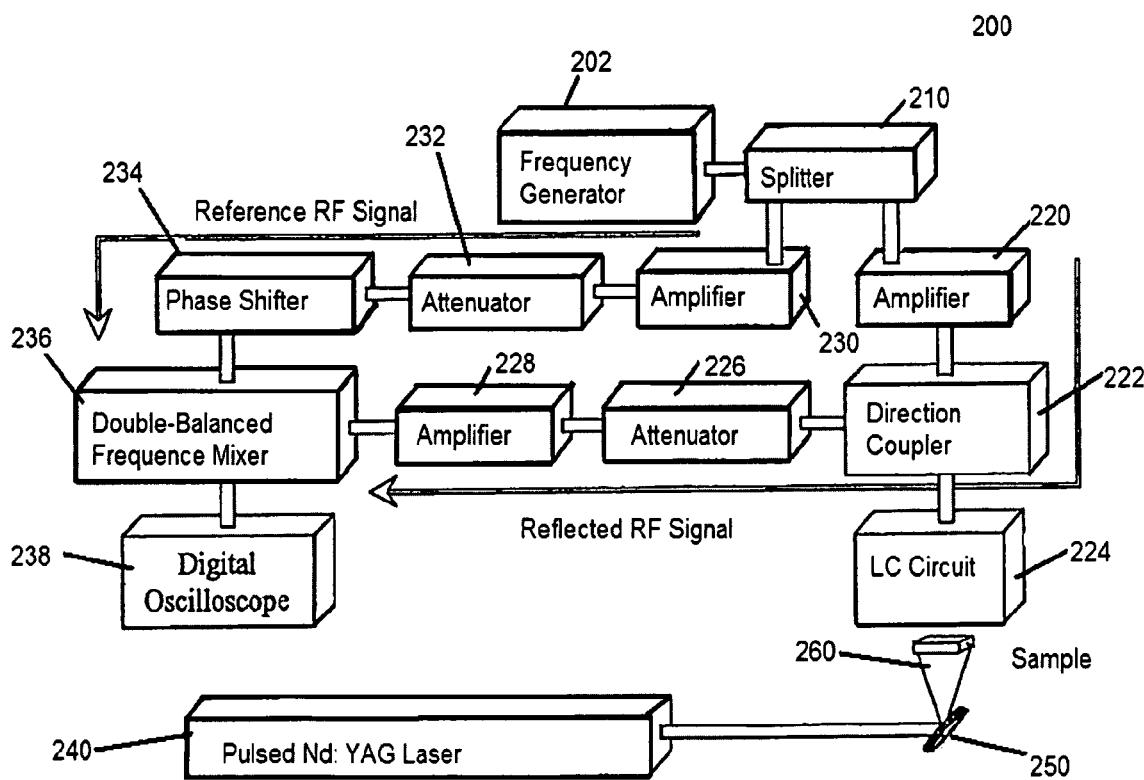
FIG. 2 includes a schematic representation of a contactless radio frequency ("RF") conductivity apparatus that can be used to measure the photoconductivity decay dynamics.

FIG. 2 includes a schematic representation of a contactless radio frequency ("RF") conductivity apparatus 200 that can be used to measure the photoconductivity decay dynamics which yield the surface recombination velocity of the surface for sample 260. The output from a high-frequency signal generator 202 operating at approximately 450 MHz can be connected to a power splitter 210, with one output of the power splitter connected to an amplifier 220 (+17 dB gain) through an attenuator 232, through a phase-shifter 234 to a reference port of a double-balanced frequency mixer 236. The other output of the power splitter 210 can be connected through an amplifier 220 (+20 dB gain) to a coupled port of a directional coupler 222 (20 dB isolation).

A pulsed Nd:YAG laser 240 can emit radiation that is reflected by mirror 250 to reach. Before the radiation reaches the sample 260, it passes through a holographic diffuser (not shown). The laser 240 and holographic diffuser are described in more detail below. A tunable inductance-capacitance ("LC") circuit 224, including a variable coupling capacitor (approximately 1-11 picoFarad ("pF"), air gap), a variable matching capacitor (approximately 1-11 pF, quartz), and a 3-turn coil (copper wire, approximately 1.1 mm diameter), is placed in close proximity to the sample 260. The LC circuit 224 is connected to another input port of the directional coupler 222.

The output port of the directional coupler 222 can be connected to an attenuator 226 (approximately 0 to −13 dB) and through an amplifier 228 to a sample input port for the frequency mixer 236. The output of the frequency mixer 236 is coupled to a digital oscilloscope 238 for measurement of the photoconductivity decay signals. Prior to each measurement, the LC circuit 224 is tuned to the resonant frequency of the sample 260 by adjusting the variable capacitors and monitoring the amplitude of the reflected RF signal on a separate high-frequency digital oscilloscope (not shown).

Returning to the laser 240 and holographic diffuser, the semiconductor substrate sample 260 can be illuminated using approximately 10 ns pulses from a Nd:YAG laser (approximately 1064 nm) operating at a repetition rate of 10 Hz. The beam may be expanded to approximately 2 $cm^2$ in diameter using a Gallilean beam expander, and the power density of the beam may be attenuated using a beam splitter and neutral density filters. A spatially uniform beam profile can be produced on the semiconductor substrate by placing a holographic diffuser(approximately 1°) directly above the sample. The incident beam power may be determined using a power that can be equipped with a pyroelectric sensor (not shown).

Using neutral density filters (not shown), the power density of the expanded, incident beam may be adjusted to either approximately $7\times10^{-4}$ mJ cm$^{-2}$ pulse$^{-1}$ for high-level injection conditions or to approximately $1\times10^{-6}$ mJ cm$^{-22}$ pulse $^{-1}$ for low-level injection conditions. After the injected carriers spread throughout the thickness of the samples, these power densities can produce photogenerated carrier concentrations of approximately $2\times10^{14}$ carriers cm$^{-3}$ at high-level injection conditions and approximately $2\times10^{11}$ carriers cm$^{-3}$ at low-level injection conditions.

During measurements of the charge carrier lifetime, the sample 260 may be placed into a sealed glass vessel (not shown) that enables collection of RF conductivity decay measurements for the sample in contact with $N_{2(g)}$, air, or various liquid solutions. Both sides of the semiconductor sample 260 may be exposed during etching and during contact with the electrolyte solutions, and both sides may therefore be active surfaces for recombination during the lifetime measurements. Lifetimes for individual samples can be obtained by averaging approximately 128 signal decays for each experiment. The mean lifetimes reported for each surface treatment can be determined by averaging the lifetimes of at least three samples that had been subjected to nominally identical surface treatments.

The observed photoconductivity decay lifetime, $\tau$ can be related to the bulk lifetime, $\tau_b$, and to the surface recombination velocity, S, through the following expression:

$$S = \frac{d}{2}\left(\frac{1}{\tau} - \frac{1}{\tau_b}\right) \quad \text{(Eq. 1)}$$

where d is the sample thickness and when both surfaces are electrically active during carrier recombination tests. Data can be fit to single exponentials using a standard least square fitting method with no weighing applied to the residuals. Unless otherwise specified, S values are reported assuming $\tau_b$ is infinity.

The following examples are offered by way of illustration and not by way of limitation. All of the samples are prepared using substantially monocrystalline silicon substrates each having a thickness of approximately 200 μm.

In a first set of examples, a two-act process of chlorination-alkylation is performed. H-terminated silicon-containing surfaces may be chlorinated by immersing the samples in a substantially saturated solution of $PCl_5$ in chlorobenzene ($C_6H_5Cl$) with benzoyl peroxide ($C_6H_5 CO_2)_2$ as a radical initiator at approximately 90-100 °C for a time period of approximately 40-50 minutes. After removing the sample from the heat, the samples may be rinsed with tetrahydrofuran (THF) and methanol, and dried with $N_2$. Alternatively, the surfaces may be chlorinated by exposing the samples to $Cl_2$ gas and illuminating them with ultraviolet ("UV") radiation for approximately 30 seconds. The chlorinated silicon-containing surface may then be immersed in $C_nH_{2n+1}MgX$ (n=1-8, X=Cl, Br, I) in THF at approximately 70-80 °C for a time period in a range of approximately 2-18 hours to obtain alkylated-surfaces. The wafer may be rinsed with THF and methanol, then sonicated in methanol and acetonitrile (CH3CN) for a time period in a range of approximately 4-6 minutes each, and finally dried with $N_2$.

For the methylated surfaces, the lifetime is approximately 260±50 μs under low-level injection and 290±80 μs under high-level injection, implying surface recombination velocities of approximately 17±7 and 21±9 cm/s for low-level and high-level injection, respectively. The samples are stable in ambient air for extended time periods, with no significant degradation in lifetime after at least approximately 30 days in an air ambient.

Similar results may occur with the octylated-surfaces formed using the two-act process. After approximately 48 hours of exposure to room air, an octylated, silicon-containing surface can exhibit lifetimes (approximately 310±90 μs under low-level injection and approximately 300±100 μs under high-level injection), and hence S values, that are substantially similar to those of the methylated surfaces. A monolayer comprising longer alkyl chains may potentially act as an improved hydrophobic barrier towards oxidation, thereby enhancing the surface stability relative to methylated silicon-containing surfaces.

Table 3 includes data for ethylated silicon-containing surfaces. The data indicates that chlorinating with PCl5 rather than chlorine gas is also effective in increasing lifetimes and reducing surface recombination velocities.

TABLE 3

Ethylated Surfaces as a Function of Time in Air.

| | $PCl_5/C_2H_5MgBr$ | | $Cl_2/C_2H_5MgBr$ | |
|---|---|---|---|---|
| Time in air | $\tau$, (μs) | SRV (cm/s) | $\tau$, (μs) | SRV (cm/s) |
| 0 min | 40 ± 20 | 350 | 30 ± 6 | 470 |
| 10 min | 70 ± 30 | 200 | 40 ± 7 | 350 |
| 1 hour | 80 ± 40 | 175 | 60 ± 10 | 230 |
| 1 day | 180 ± 100 | 78 | 70 ± 30 | 200 |
| >1 day | 200 ± 70 | 70 | 80 ± 30 | 175 |

Silicon-containing surfaces can be alkylated using a one-act reduction of a terminal olefin by a Lewis acid on the surface to form an alkylated silicon-containing surface. H-terminated silicon-containing surfaces can be immersed in approximately equal volumes of $CH_2=C_nH_{2n}$ (n=5, 7, 9) and approximately 1.0 M $EtAlCl_2$ in a hexane solution at room temperature (approximately 17-25° C.) for a time period in a range of approximately 11-13 hours. The samples may be removed from the alkylating solution, rinsed in THF, methylene chloride, and methanol, and dried with $N_2$. Table 4 includes data for hexyl (C6), octyl (C8), and dodecyl (C12) functional groups.

TABLE 4

C6, C8, and C12 Surfaces as a Function of Time in Air.

| | Hexyl | | Octyl | | Dodecyl | |
|---|---|---|---|---|---|---|
| Time in air | $\tau$, (μs) | SRV (cm/s) | $\tau$, (μs) | SRV (cm/s) | $\tau$, (μs) | SRV (cm/s) |
| 0 min | 200 ± 100 | 70 | 200 ± 7 | 70 | 120 ± 30 | 120 |
| 10 min | 20 ± 3 | 700 | 20 ± 4 | 700 | 20 ± 1 | 700 |

Initially (substantially no air exposure), the data for the one-act olefin reduction are better compared to two-act chlorination/alkylation. However, the one-step olefin reduction process has decreased lifetimes and increase surface recombination velocities when air exposure time increases. At approximately 10 minutes of air exposure, the two-act process gives better electronic performance compared to the one-act process. Still, the one-act process has utility and can be used, particularly if air exposure is relatively short.

In still another non-limiting example for a polymer film, an olefin-terminated silicon-containing surface (as previously formed as described above with respect to the polymer general examples) can react with an olefin metathesis catalyst [(Cy$_3$P)$_2$Cl$_2$Ru=CHPh, Cy=cyclohexyl] ("compound 1") by immersing the samples for a time period in a range of approximately 2.5-3.5 hours into an approximately 25 millimolar solution of compound 1 in CH$_2$Cl$_2$. The samples may be rinsed several times with CH$_2$Cl$_2$ to remove any non-bound catalyst. Exposure of the surface-bound catalyst to an approximately 0.01-2.44 M solution of the norbornene monomer for a time period in a range of 25-35 minutes in 1,2-dichloroethane can result in the growth of a polymeric film on the silicon-containing surfaces of the semiconductor substrate. Polynorbornene films between 0.9 and 5500 nm in thickness can be produced through the use of 0.01 to 2.44 M solutions of norbornene monomer.

Because polymerization initiated by compound 1 is a controlled polymerization process, different film thicknesses can be obtained by varying the concentration of norbornene monomer in 1,2-dichloroethane solutions. Table 5 summarizes the thicknesses of several polymer films that may be produced at a fixed reaction time (approximately 30 minutes) for various concentrations of monomer in the solution. The standard deviation in the thickness data measured at six different spots for each sample may be less than approximately ±10% of the mean value, indicating that the polymer film covers substantially all the silicon-containing semiconductor substrate.

TABLE 5

Dependence of Polymer Film Thickness On Concentration of Norbornene in Solution

| Monomer Concentration (M) | Thickness (nm) |
|---|---|
| 0.01 | 0.9 ± 0.1 |
| 0.09 | 12.0 ± 1.4 |
| 0.18 | 42.0 ± 14.0 |
| 0.27 | 128.0 ± 66.0 |

Samples for lifetime testing can include can include Si-allyl surfaces, a first set of Si-allyl-PNB (polynorbornene) surfaces, and other allyl-PNB surfaces. The lifetimes of the samples are approximately 48 microseconds for the Si-allyl surfaces are approximately 34 microseconds for the first set of the Si-allyl-PNB surface. For the other Si-allyl-PNB surfaces from the other samples, the lifetimes are in a range of approximately 77-431 microseconds.

The process may be used for a wide range of monomers that can be polymerized and could be used to form layers of controlled thickness on silicon-containing surfaces. In other embodiments, the first polymer may be conductive or semiconductive when cyclooctatetraenes, phenylenevinylenes, or the like are used as feedstocks. The process may allow the formation of semiconductor/metal or semiconductor heterojunction structures.

In other non-limiting embodiments, H-terminated silicon-containing surfaces may be exposed to successive immersions in an alcoholic halogen solution or in an alcoholic solution of a one-electron oxidant such as ferrocenium (Fc$^+$). In the first implementation, H-terminated silicon-containing surfaces may be exposed to a CH$_3$OH-0.05 M I$_2$ solution, followed by nitrogen gas. In the second implementation, the samples may be exposed to CH$_3$OH-0.05 M Fc-0.05 M Fc$^+$ followed by N$_{2(g)}$. Table 6 includes data collected for low-injection and high-injection conditions.

TABLE 6

Data for Alcohol Solutions (Alkoxides)

| | Low-Injection | | High-Injection | |
|---|---|---|---|---|
| | τ (μs) | S (cm/s) | τ (μs) | S (cm/s) |
| Alcohol-halogen solution | | | | |
| 1) CH$_3$OH-0.05 M I$_2$ | 520 ± 90 | 19 ± 3 | 600 ± 300 | 16 ± 8 |
| 2) N$_2$ | 7.8 ± 0.8 | 1300 ± 100 | 12 ± 1 | 810 ± 70 |
| 3) CH$_3$OH-0.05 M I$_2$ | 500 ± 100 | 20 ± 4 | 700 ± 200 | 14 ± 4 |
| Alcohol-ferrocene solution | | | | |
| 1) CH$_3$OH-0.05 M Fc-0.05 M Fc$^+$ | 500 ± 100 | 20 ± 4 | 700 ± 200 | 14 ± 4 |
| 2) N$_2$ | 150 ± 60 | 70 ± 30 | 140 ± 40 | 70 ± 20 |
| 3) CH$_3$OH-0.05 M Fc-0.05 M Fc$^+$ | 470 ± 40 | 21 ± 2 | 600 ± 20 | 16 ± 1 |
| 4) THF-0.05 M Me$_{10}$Fc-0.01 M Me$_{10}$ | 120 ± 20 | 80 ± 10 | 101 ± 8 | 98 ± 8 |

As can be seen by the data in Table 6, an alkoxylation reaction can occur in the iodine-alcohol solution. An XP (X-ray photoelectron) survey spectrum obtained on surfaces that had been immersed into CH$_3$OH-0.05 M I$_2$ and then rinsed with CH$_3$OH showed approximately 0.2-0.3 monolayer of persistently-bound iodine, while scans of the Si 2 p region showed the formation of approximately 0.2-0.3 monolayer of partially oxidized Si at 102.6 BeV (binding electron volts). The amount, position, and shape of this 102.6 BeV peak is virtually identical to that of the oxidized Si peak observed for silicon-containing surfaces that are exposed to CH$_3$OH-0.2 M FcBF$_4$. From the data, at least some, but not all, of the silicon surface is bonded to a methoxy group (—OCH3). More of the silicon at the surface is bonded to the methoxy groups if a ferrocenium solution is used, and such surfaces produce longer lifetimes and lower surface recombination velocities, S.

Specific examples of chemicals and some other alkoxylation reaction details are given below. Five combinations of crystal orientation and alkoxylations (with approximate reaction temperatures and reaction times in parentheses, performed in the presence of a one-electron oxidant, a halogen, or from a reactive silicon-containing surface) may include: (100)-oriented Si with approximately 1 M LiOCH$_3$—CH$_3$OH (80° C., 21.5 hours), (100)-oriented Si with approximately 1 M LiOCD$_3$-CD$_3$OD (70° C., 23.5 hours), (111)-oriented Si with approximately 1 M LiOCH$_3$—CH$_3$OH (75° C., 19 hours), (111)-oriented Si with approximately 1 M LiOCD$_3$-CD$_3$OD (70° C., 19 hours), and (111)-oriented Si with approximately 1 M LiO(CH$_2$)$_3$CF$_3$-THF prepared by adding approximately 7.5 mL of approximately 2.5 M LiC$_4$H$_9$ in a hexane solution to approximately 2.6 mL of HO(CH$_2$)$_3$CF$_3$ in approximately 20 mL of THF (80° C., 15.5 hours).

The organic passivation layer may have uses in many different types of electrical structures and devices. In some of the applications, the organic layer may be useful in helping to improve or otherwise significantly alter or change the electrical properties of the electronic device or semiconductor device including discrete components or integrated circuits. In other applications, the chemically-bonded organic layer may be useful to help reduce the likelihood of oxidizing or contaminating a semiconductor surface between processing acts. The organic layer may help to lengthen queue times or potentially eliminate the queue times. The embodiments below better illustrate these features.

Figure 3:
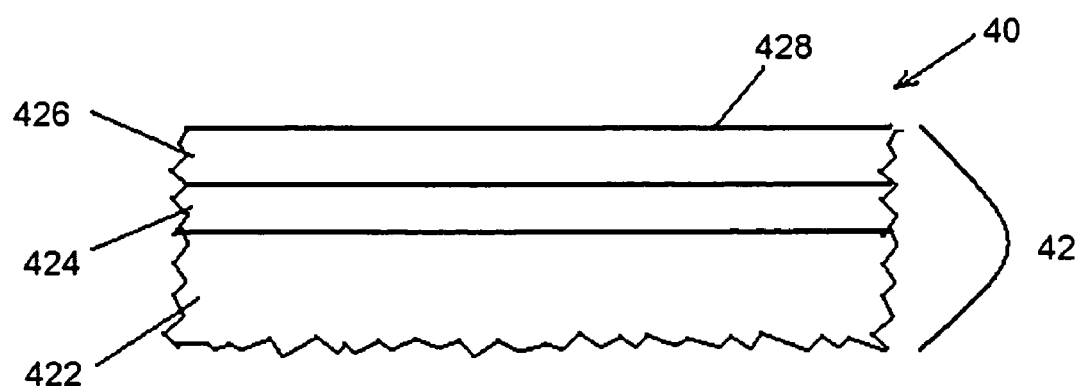
FIGS. 3 and 4 include illustrations of cross-sectional views of a portion of a semiconductor substrate during the formation of a photovoltaic cell with an organic passivation layer.

FIG. 3 includes an illustration of a cross-sectional view of a portion of a semiconductor substrate 42. The substrate 42 includes a heavily doped p-type region 422, a relatively lightly doped p-type region 424, and a heavily doped n-type region 426 at the surface 428. Such an electronic structure may be used as part of a photovoltaic cell 40. Heavily doped regions may have dopant concentrations of at least approximately $1 \times 10^{19}$ atoms per cubic centimeter (to provide ohmic contacts) and lightly doped regions may have a dopant concentration no higher than approximately $1 \times 10^{18}$ atoms per cubic centimeter.

Figure 4:
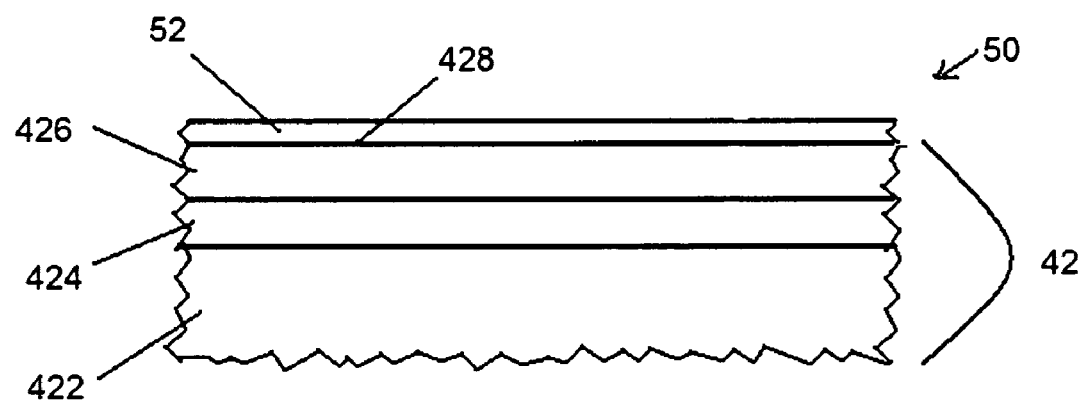

An organic layer 52 is then formed over the surface of the n-type region 426 as illustrated in FIG. 4. The organic layer 52 may be formed using any of the previously described processes. The organic layer 52 may be chemically bonded to the semiconductor substrate 40 at the surface 428 of the n-type region 426 to form an organically passivated photovoltaic cell 50.

Because of the organic layer is chemically bonded to the semiconductor substrate 40 at the surface 428, dangling bonds in the photovoltaic cell 50 are reduced compared to the photovoltaic cell 40 (if the organic layer would not be formed). The carrier lifetime is increased, and the surface recombination velocity is decreased for photovoltaic cell 50. Therefore, the electronic efficiency of the electronic device is improved. As used herein, electronic efficiency is defined as 100 percent times the fraction of electrons that pass through or are generated by the electrical device divided the total number of electrons that could be used for electronic current. The divisor in the fraction is substantially a sum of electrons that form electron-hole pairs and electrons that pass through or are generated by the electrical device. Also, the voltage produced by the device under illumination is improved because fewer carriers recombine at the surfaces of the device and more are available for use in device output performance properties. Note that the organic layer 52 affects an electrical property within the semiconductor substrate 42, even though virtually none of the organic layer 52 lies within the substrate 42 and little if any electrons pass through the organic layer.

If the surface 428 is not properly passivated (e.g., photovoltaic cell 40), the photovoltaic cell 40 may have a short carrier lifetime and a relatively high surface recombination velocity because electron-hole pairs are more likely to recombine thereby reducing the electronic current generated by the photovoltaic cell 40.

Other geometries are also possible for photovoltaic cells, including structures that have various combinations of p-doped, intrinsic, and n-doped layers arranged in various geometries. Such structures are well known to skilled artisans. The chemically bonded organic layer may be used on one or more surfaces or surface regions of such structures to impart improved electrical properties to the device as a whole formed after such surfaces have been modified using said chemically bonded organic layer.

Figure 5:
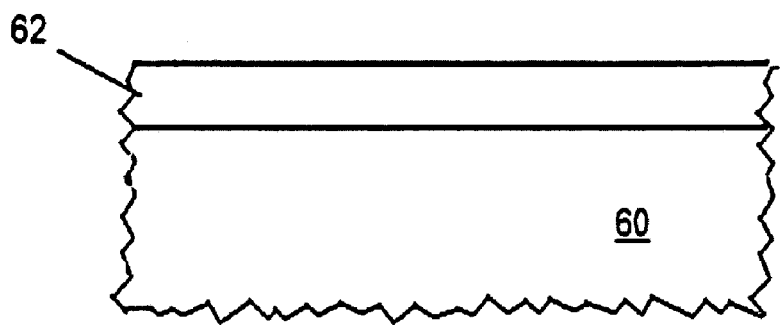
FIGS. 5 and 6 include illustrations of cross-sectional views of a portion of a semiconductor substrate when an organic layer is used as part of a gate dielectric layer.

FIG. 5 includes an illustration of a cross-sectional view of a portion of a semiconductor substrate 60. An organic layer 62 is formed over the semiconductor substrate 60 using any of the methods previously described. The organic layer 62 may include an alkyl group, an allyl group, an alkoxide, or the like including functional groups listed in Table 1. The physical thickness of the organic layer may be no greater than approximately 10 nm. The organic layer may have an oxide equivalent thickness in a range of approximately 1-5 nm. An oxide equivalent thickness is an equivalent thickness of silicon dioxide that would give the same capacitance if a capacitor structure would be formed.

Figure 6:
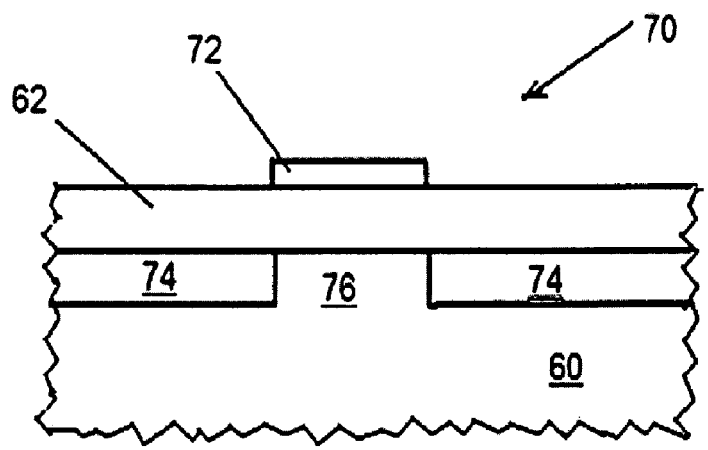

A gate electrode (control electrode) 72 is then formed over the organic layer 62 using conventional deposition and etching techniques and is illustrated in FIG. 6. Source/drain regions 74 can be formed within the semiconductor substrate 60. The portion of the semiconductor substrate 60 between the source/drain regions 74 defines a channel region 76 for the metal-oxide-semiconductor field-effect transistor ("MOSFET"). Therefore, a field-effect transistor can be formed where the organic layer may be part of the gate dielectric for the transistor.

For the prior example, the source/drain regions 74 have a conductivity type opposite that of the semiconductor substrate 60. The structure in FIG. 6 can be modified to become a capacitor. The conductivity type of the source/drain regions 74 may be changed to be the same as the semiconductor substrate 60, and the source/drain regions 74 may be electrically connected to each other. A combination of the source/drain regions 74 and the substrate form one capacitor electrode, and the gate electrode 72 is the other capacitor electrode. The organic layer 62 is the capacitor dielectric.

Figure 7:
FIGS. 7 and 8 include illustrations of cross-sectional views of a portion of a semiconductor substrate when an organic layer is used in conjunction with a high-k material for a gate dielectric layer.

An organic layer may be formed and used with a high-k dielectric material. As used herein, a high-k dielectric material has a dielectric constant of at least approximately 10. As illustrated in FIG. 7, an organic layer 82 has been formed over the semiconductor substrate 80. The organic layer 82 should be kept relatively thin, such as a monolayer. In some embodiments, the organic layer 82 may comprise organic groups, each of which has no more than approximately three carbon atoms. A high-k gate dielectric material 84 may be formed over the organic layer 82. Examples of the high-k material 84 include titanium dioxide, strontium titanate, tantalum pentoxide, or other metal-oxide materials having a dielectric constant of at least approximately 10. The high-k gate dielectric material 82 may be deposited using conventional techniques.

Figure 8:
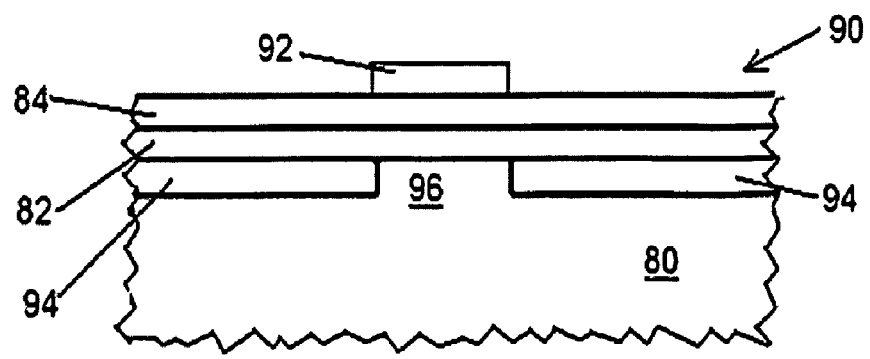

A gate electrode 92 and source/drain regions 94 are formed to produce the device illustrated in FIG. 8. The gate electrode 92 and source/drain regions 94 are formed using conventional techniques. The portion of the semiconductor substrate 80 between the source/drain regions 94 defines a channel region 96 for the MOSFET. The organic layer 82 may help to reduce dangling bonds and interface states that would otherwise be present if the high-k gate dielectric material 84 would be formed directly if the semiconductor substrate or if a native oxide layer would lie between the semiconductor substrate 80 and the high-k gate material 84 and the substrate 80. Therefore, a field-effect transistor can be formed where the organic layer 82 better allows the use of a high-k gate material 84 for the gate dielectric of the transistor.

Figure 9:
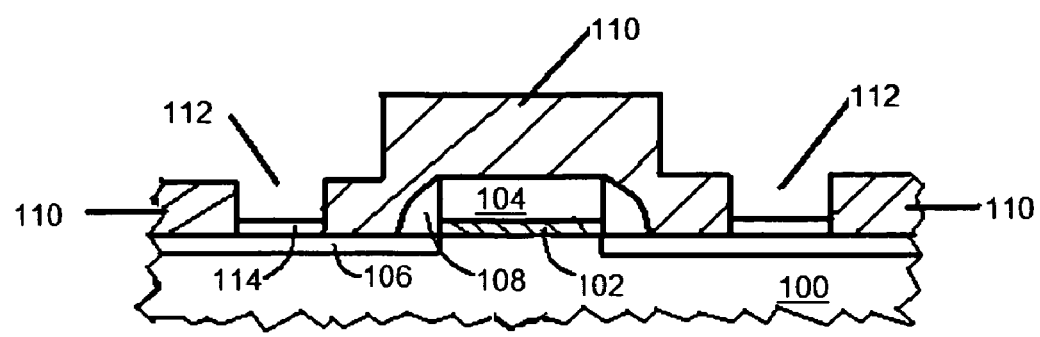
FIGS. 9-11 include illustrations of cross-sectional views of a portion of a semiconductor substrate where an organic layer is formed prior to the formation of an electrical contact.
Figure 10:
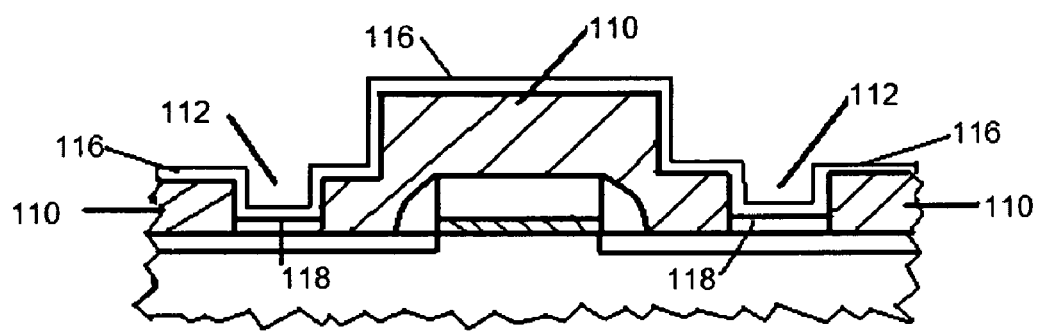

The organic layer may be useful in passivating silicon-containing surfaces where oxidation or other adverse reactions could occur. These may be useful in electrical contact and doping applications. FIG. 9 includes an illustration of a cross-sectional view of a portion of a semiconductor substrate 100. A gate dielectric layer 102, a gate electrode 104, source/ drain regions 106, spacers 108, and a patterned insulating layer 110 have been formed using conventional techniques. The patterned insulating layer 110 defines openings 112 that may expose portions of the semiconductor substrate 100 at the source/drain regions 106. If those exposed portions are not protected, a native oxide or other contaminants may reside along the surface of the semiconductor substrate 100 within the openings 112 and may adversely affect the electrical device.

In some instances, very short queue times between processing acts may be used to reduce these adverse effects. However, queue times are difficult to manage in manufacturing operations. If the equipment for a subsequent act is not operational or a backlog of material exists at that equipment, the queue times may not be met and additional processing may be required. Some of this processing may include exposing the substrate to an additional oxide etch, such as a fluorine-containing solution. This additional processing increases processing time, increases the likelihood of misprocessing, or may cause other processing complications, such as an electrical short to an undesired region due to the extra oxide etching.

An organic layer 114 can be formed along the exposed surfaces of the semiconductor substrate 100 as illustrated in FIG. 9. The organic layer 114 allows a relatively low temperature passivation layer to be formed along the bottoms of openings 112 to reduce the likelihood of requiring relatively short queue times. Queue times of approximately four hours or longer may be achieved with the organic passivation layer. In many instances, the queue time limit may extend greater than one day and could potentially be increased to more than approximately one week. This longer queue time allows more processing flexibility at a manufacturing plant and reduces the likelihood of a re-work or other additional processing act that would otherwise not be necessary. In one embodiment, queue times listed above may represent the time between forming the organic passivation layer 114 and its subsequent removal. Unlike photoresist layers, no etching may be performed between forming and completely removing the organic passivation layer 114.

The semiconductor substrate 100 with the passivation layer 114 lying along the bottoms of the contact openings 112 may be placed in a sputtering or other deposition chamber. An initial act may be performed to remove the organic layer 114 before forming a metal-containing layer. A backsputter act or other equivalent processing act may be used to remove the organic layer 114 from the bottoms of the contacts. A refractory metal layer 116, which is a metal-containing layer that may include titanium, cobalt, or the like, may be formed along the exposed services of the pattern insulating layer 110 and the exposed portion of the semiconductor substrate 100. The substrate 100 may be annealed to form metal-silicide portions 118 along the bottom of the contact openings 112.

Figure 11:
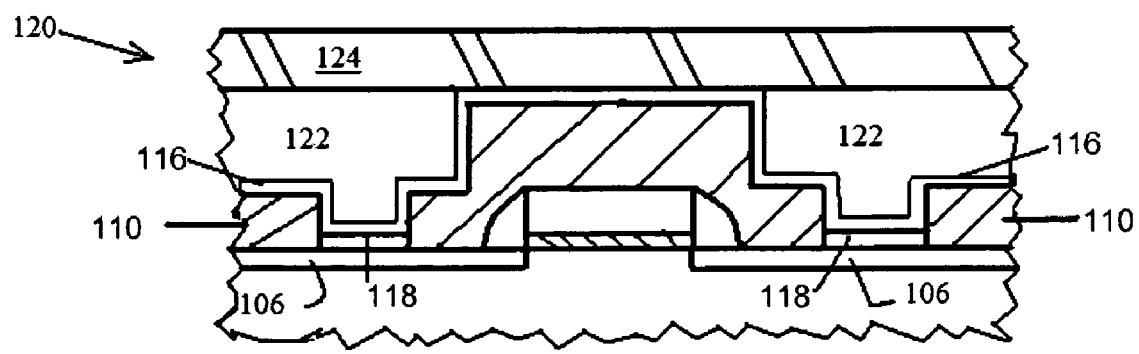

A conductive, metal-containing layer 122 may be formed over the refractory metal layer 116 and silicide portions 118. The conductive, metal-containing layer 116 may include aluminum, copper, tungsten, or the like. A polishing or etching act may be performed to remove portions of the conductive metal-containing layer 122 and refractory metal layer 116 overlying the uppermost surface of the pattern insulating layer 110 as shown in FIG. 11 to form the interconnects 120 that are electrically connected to the source/drain regions 106. Although not shown, other electrical connects are made other portions of the electrical device, such as the gate electrode 104. An inorganic passivation layer may be formed over the interconnects and pattern insulating layer to form a substantially completed device.

Figure 12:
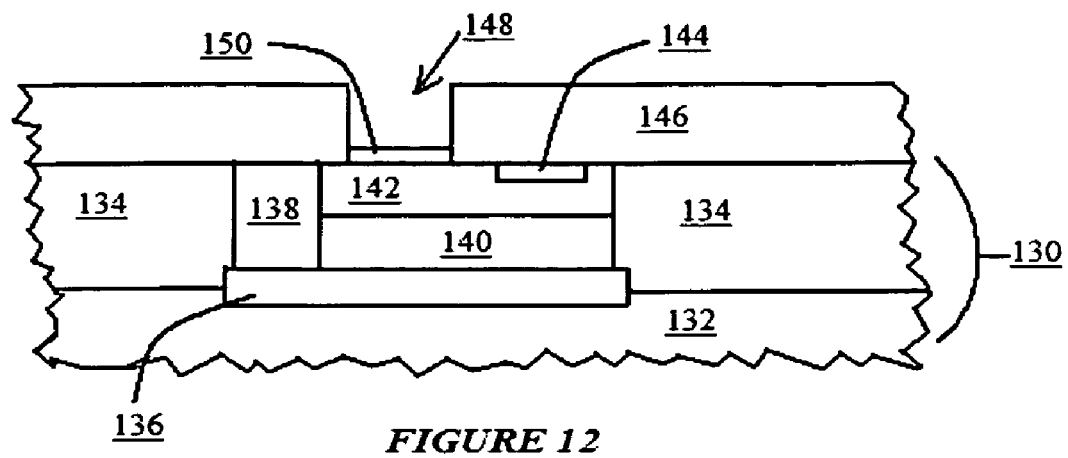
FIGS. 12-15 include illustrations of cross-sectional views of a portion of a semiconductor substrate where an organic layer is used before forming an emitter region for a bipolar transistor.

The principles described previously can be extended to situations where dopant diffusion needs to occur from one layer to an underlying region, such as an underlying layer or semiconductor substrate. FIG. 12 includes an illustration of a cross-sectional view of a semiconductor substrate 130 after performing acts in fabricating a bipolar transistor. FIG. 12 includes a p-type semiconductor bulk material 132, a heavily doped n-type buried layer 136, isolation regions 134, a collector contact region 138, an n-type drift region 140, a p-type active base region 142, and a p-type inactive base region 144. A patterned insulating layer 146 is formed over the substrate and defines an opening 148 where an emitter for the bipolar transistor is to be formed as illustrated in FIG. 12. Processing acts used in fabricating the device up to this point in time are performed using conventional techniques.

Similar to the contact example previously described, oxidation or other impurities introduced within opening 148 may cause adverse effects to the semiconductor device during subsequent processing acts. For example, if an oxide layer formed at the bottom of the opening 148, dopant diffusion from a subsequently formed layer may not occur due to the presence of the oxide layer along the bottom of the opening. Therefore, a queue time may be necessary between forming the opening 148 and doping a portion of the active base region 142 to form an emitter for the bipolar transistor.

An organic layer 150 may be formed along an exposed surface of a portion of the active base region 142 at the bottom of the opening 148. The active base region 142 typically includes a crystalline semiconductor material that is lightly doped. The organic layer 150 may help to reduce the likelihood of formation of an oxide layer along the bottom of the opening and may also reduce the likelihood of introducing unwanted impurities or other contaminants into the active base region 142. By using the organic layer 150, a relatively longer queue time may be used before forming the emitter for the bipolar transistor. Alternatively, the queue time may be eliminated.

Figure 13:
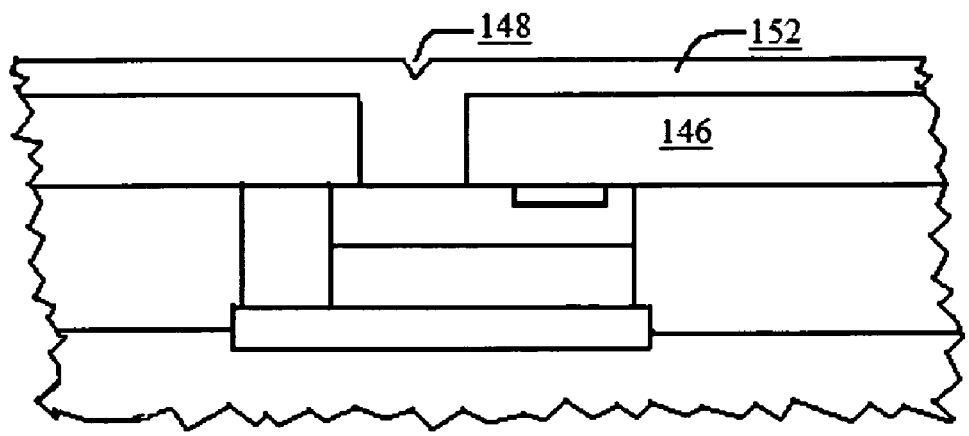
Figure 14:
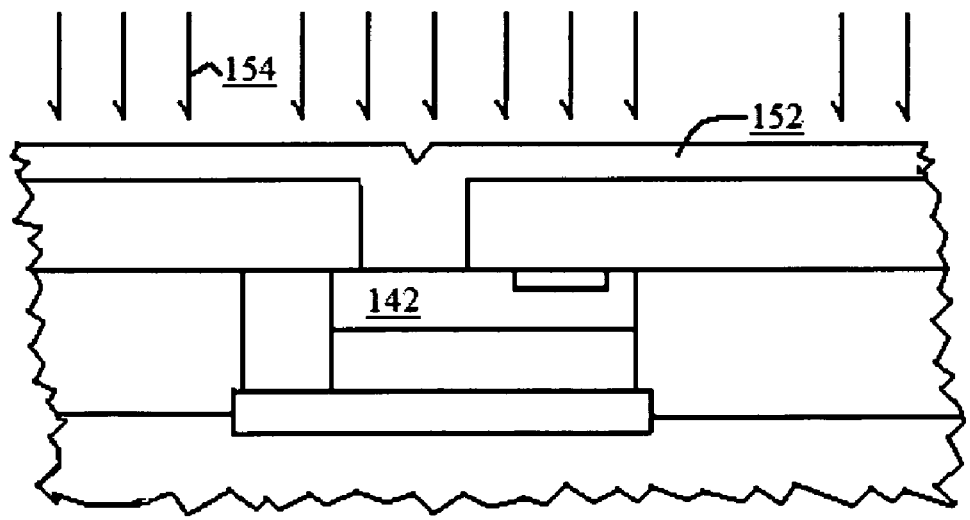

The organic layer 150 may be removed and a silicon-containing layer 152 may be formed within the opening 148 and over the patterned insulating layer 146. The silicon-containing layer 152 may be in situ doped or may be doped during a subsequent doping act. In one embodiment, the silicon containing-layer 152 as shown in FIG. 13 may be substantially undoped. A subsequent implant act may be performed as illustrated by the arrows 154 in FIG. 14. The doping may include an n-type dopant (phosphorus, arsenic, antimony, or the like). The silicon-containing layer 152 can be a dopant-source layer.

Figure 15:
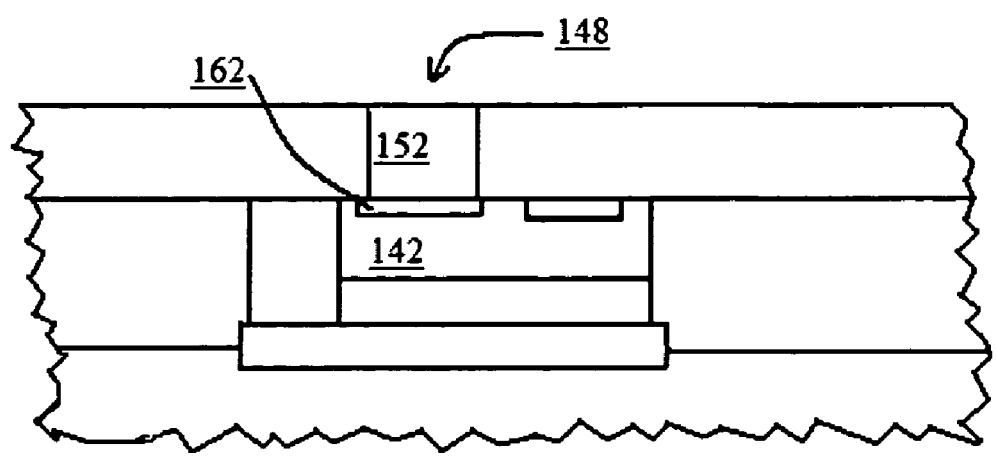

An anneal cycle may be performed to diffuse the dopant throughout the silicon-containing layer 152 to make it conductive and also to drive some of the dopant into the active base region 142 to form an emitter region 162 for the bipolar transistor as shown in FIG. 15. Portions of the silicon-containing layer 152 that lie outside the opening 148 may be removed by polishing, etching, or the like to give the structure a shown in FIG. 15. At this point in the process, a bipolar transistor has been formed. Subsequent processing acts may be performed to form other pattern insulating layers, conductors, inorganic passivation layers, or the like in order to form a substantially completed device. These subsequent acts after formation of the connector are conventional. In an alternate embodiment, a doped glass layer could be used as the dopant-source layer instead of the silicon-containing layer 152.

Figure 16:
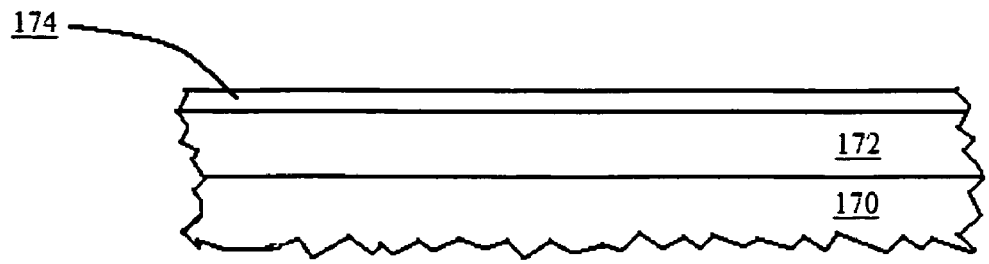
FIGS. 16-19 include illustrations of cross-sectional views of a portion of a semiconductor substrate where an organic layer is used in Schottky diodes.
Figure 17:
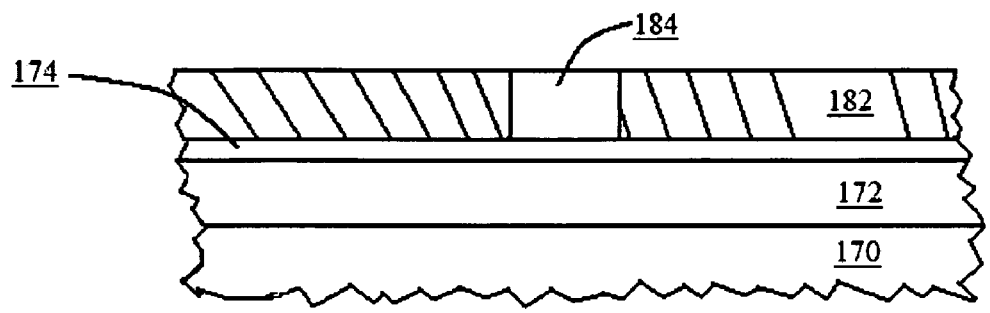

Schottky diodes may also be formed using the organic layer. In FIG. 16, an epitaxial, lightly p-type doped silicon containing layer 172 may be formed over a heavily doped p-type semiconductor bulk material 170. An organic layer 174 may be formed as previously described. The organic layer 174 is chemically bonded to the epitaxial layer 172. A patterned insulating layer 182 and an interconnect 184 are formed over the organic layer 174. If the organic layer 174 is relatively thin, the organic layer 174 acts as a "leaky" capacitor; however it is thick enough to substantially prevent a reaction between the silicon in the epitaxial layer 174 and a metal within the interconnect 184. A backside contact (not shown) is made to the bulk material 170 to complete electrical contacts for the Schottky diode.

Figure 18:
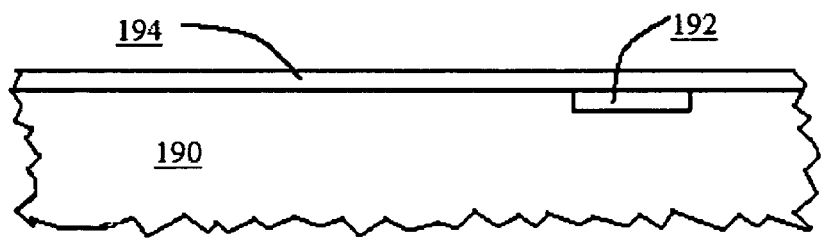
Figure 19:
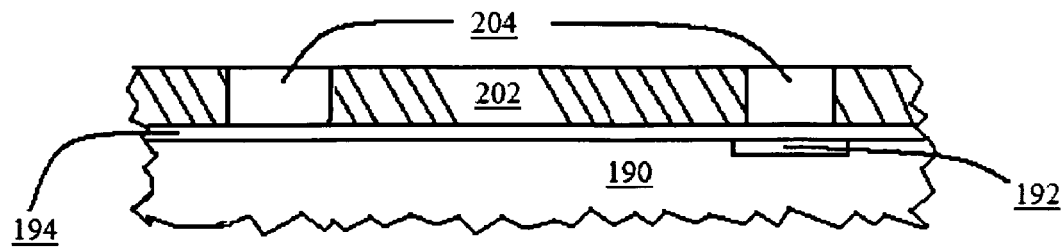

In still another embodiment, both contacts for a Schottky contact may be made on the same side of a substrate. In FIG. 18, a lightly p-type doped silicon-containing substrate 190 includes a heavily p-type doped region. An organic layer 194 is formed over the substrate 190 and doped region 192 using a process as previously described. A patterned insulating layer 202 and interconnects 204 as shown in FIG. 19. Again, the organic layer 194 acts as a leaky dielectric. The right-hand side interconnect 204 effectively forms an ohmic contact with the substrate 190. The left-hand side contact effectively forms a Schottky contact. The combination of the features shown in FIG. 19 can be used to as a Schottky diode.

Silicon-containing metal-insulator-semiconductor (MIS) devices can be fabricated. The surface of Si (111) can be functionalized with n-alkyl groups using the two-step $PCl_5$ chlorination/Grignard alkylation procedure previously described above. The bonded aliphatic layer on the surface can serve as the insulating layer of the MIS device. The length of the alkyl chain can be used to vary the thickness of the insulating layer. A 0.04 $cm^2$ Hg drop can be placed on the functionalized Si surface to form the metal layer of the MIS device. I—V characteristics of the device may be measured by making an ohmic contact to the back of the sample with Ga/In eutectic and silver epoxy that was in electrical contact with a copper plate. The front contact of the device can be made with a Pt wire immersed in the Hg drop.

Figure 20:
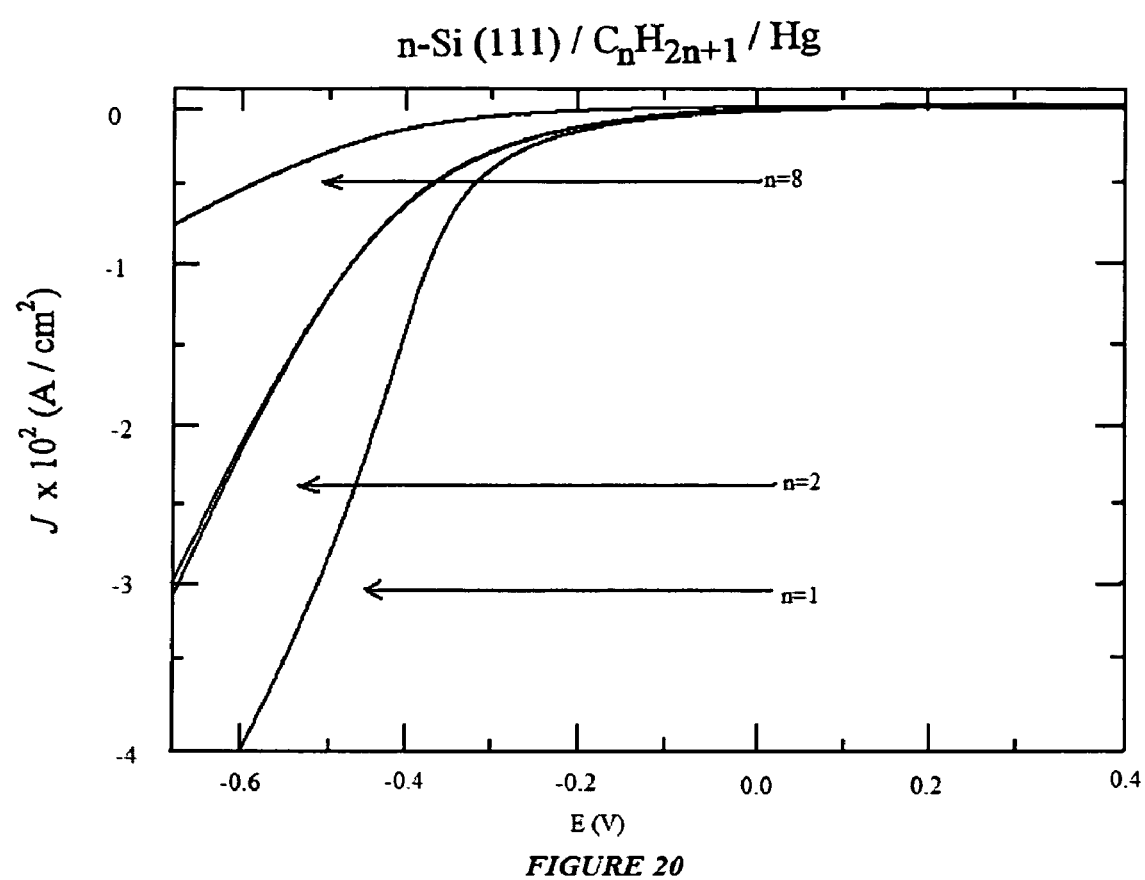
FIG. 20 shows I—V behavior of MIS devices with a chemically bonded insulating layer having the composition $C_nH_{n+1}$ with n=1, 2, 8.
Figure 21:
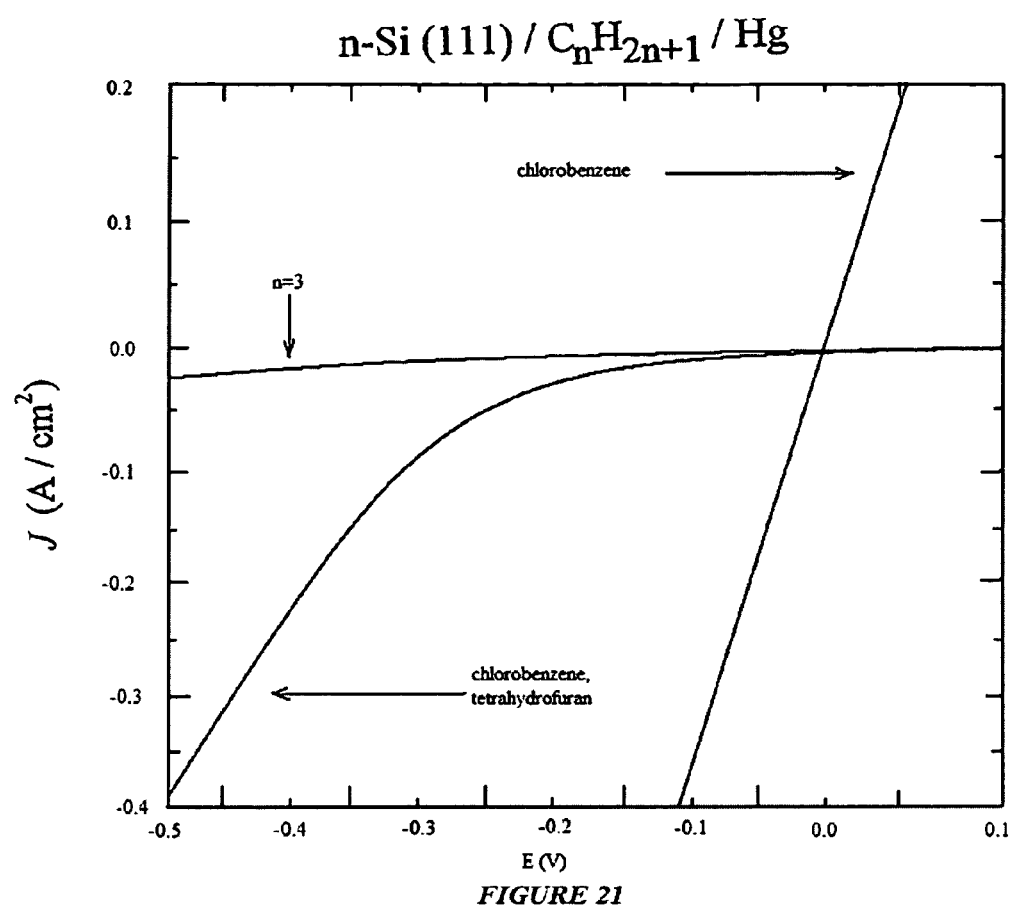
FIG. 21 compares the I—V behavior of MIS devices with and without a chemically bonded hydrocarbon insulating layer.

FIG. 20 shows I—V behavior of MIS devices with insulating layers $C_nH_{n+1}$ with n=1, 2, 8. The data show that increasing the thickness of the insulating layer decreases the current density between the semiconductor and the metal and provides improved rectification and other electrical properties of such devices as compared to the devices made without the chemically bonded layer. FIG. 21 compares the I—V behavior of MIS devices with and without the bonded hydrocarbon insulating layer. A MIS device with $C_3H_7$ as an insulating layer shows the same diodic behavior as seen in FIG. 20. H-terminated Si (111) surfaces that are immersed either in chlorobenzene or chlorobenzene followed by THF, and therefore, are not functionalized and do not have the insulating layer, display ohmic-like behavior.

After reading this specification, skilled artisans will appreciate that the organic passivation layer used with these various silicon-containing surfaces in electrical devices can be extended to many other applications. The applications presented are to illustrate some of the advantages of embodiments of the present invention and are not meant to limit it. Other applications can be used where electrical properties need to be improved or kept at least to a minimal level. These properties can include carrier lifetime, surface recombination velocities, electron efficiency, contact resistance, resistance of doped regions, or the like. Further, the principles described here in may be extended to other silicon-containing layers throughout electrical devices and may include load resistors, thin film transistors, junction field-effect transistors (JFETs), metal-insulator-semiconductor field-effect transistors (MISFETs) including metal-oxide-semiconductor field-effect transistors (MOSFETs) and complementary metal-oxide-semiconductor (CMOS) transistors, CMOS amplifiers, tunnel diodes, or the like. The silicon-containing substrates, materials, and layer are not porous, and therefore, can be used in electrical devices. Proper formation and cleaning procedures should be followed to reduce the likelihood of causing reliability problems that are sometimes seen with organic layers that contact electrically active silicon-containing layers.

Many other electrical structures and devices can be formed. Some of these devices are described in many different textbooks and articles. *VLSI Technology*, edited by Sze, Bell Telephone Laboratories, 1983; *Microelectronics: Processing and Device Design* by Colclaser, John Wiley & Sons, 1980; *Silicon Processing for the VLSI Era: Vol. 1 Process Technology* by Wolf, Lattice Press, 1986; *Silicon Processing for the VLSI Era-Vol. 2: Process Integration* by Wolf, Lattice Press, 1990; *Silicon Processing for the VLSI Era: Vol. 3-The Submicron MOSFET* by Wolf, Lattice Press, 1995 include examples of such electrical structures and devices and are incorporated herein by reference.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming a semiconductor substrate, comprising:

providing a monocrystalline silicon-containing material having a porosity of not more than 30%, H-terminated and having a surface substantially free of oxidation; and forming an organic layer having more than half of its atoms being carbon and hydrogen in the presence of an alcohol-ferrocene solution, wherein the organic layer is chemically bonded to the surface of the silicon-containing material, wherein an electrical property selected from surface recombination velocity, carrier lifetime, electronic efficiency, voltage, device capacitance, contact resistance, and resistance of a doped region of the semiconductor substrate is changed at compared to the electrical property of the substrate in the absence of the organic layer, thereby forming a semiconductor substrate, and wherein as a result of said organic layer being chemically bonded to the surface of the silicon-containing material, said surface comprises a measurable carrier lifetime for low-level injection of more than approximately 7.8 μs or for high-level injection of more than approximately 12 μs, or a measurable surface recombination velocity of less than approximately 1300 cm/s for low-level injection or 810 cm/s for high-level injection.

2. The process of claim 1, wherein the organic layer comprises a monolayer.

3. The process of claim 1, wherein the organic layer comprises a polymer.

4. The process of claim 1, wherein forming the organic layer comprises:
   activating the surface of the silicon-containing material to form an activated surface;
   reacting the activated surface with a chemical, wherein during the reaction, a hydrocarbon group becomes chemically bonded to the silicon-containing material.

5. The process of claim 4, wherein activating comprises halogenating the surface of the silicon-containing material to form the activated surface.

6. The process of claim 5, wherein the hydrocarbon group has no more than nine carbon atoms.

7. The process of claim 6, wherein the hydrocarbon group is an alkyl group.

8. The process of claim 4, wherein the hydrocarbon group is an allyl group.

9. The process of claim 8, further comprising forming a polymer layer from the allyl group.

10. The process of claim 4, wherein the hydrocarbon group is an alkoxide group.

11. The process of claim 1, wherein as a result of said organic layer being chemically bonded to the surface of the silicon-containing material, said surface comprises a methylated surface with measurable carrier lifetimes for low-level injection of at least approximately 260 µs or for high-level injection of at least approximately 290 µs, or with measurable surface recombination velocities of not more than approximately 17 cm/s for low-level injection or 21 cm/s for high-level injection, or combinations thereof.

12. The process of claim 1, wherein as a result of said organic layer being chemically bonded to the surface of the sincon-containing material, said surface comprises an ethylated surface with measurable carrier lifetimes of more than approximately 40 µs or with measurable surface recombination velocities of less than approximately 350 cm/s, or both.

13. The process of claim 1, wherein as a result of said organic layer being chemically bonded to the surface of the silicon-containing material, said surface comprises an ethylated surface with measurable carrier lifetimes of more than approximately 30 µs, or with measurable surface recombination velocities of less than approximately 470 cm/s, or both.

14. The process of claim 1, wherein as a result of said organic layer being chemically bonded to the surface of the silicon-containing material, said surface comprises a hexylated, octylated or dodecylates surface with measurable carrier lifetimes of at least approximately 20 µs, or with measurable surface recombination velocities of not more than approximately 200 cm/s, or both.

15. The process of claim 1, wherein as a result of said organic layer being chemically bonded to the surface of the silicon-containing material, said surface comprises an alkoxylated surface with measurable carrier lifetimes of more than approximately 150 µs for low-level infection or more than approximately 140 µs for high-level injection, or with measurable surface recombination velocities of not more than approximately 70 cm/s, or combinations thereof.

\* \* \* \* \*